(12) United States Patent
Yoshida

(10) Patent No.: US 6,174,370 B1
(45) Date of Patent: Jan. 16, 2001

(54) SEMICONDUCTOR WAFER CHUCKING DEVICE AND METHOD FOR STRIPPING SEMICONDUCTOR WAFER

(75) Inventor: Hideo Yoshida, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 08/827,312

(22) Filed: Mar. 26, 1997

(30) Foreign Application Priority Data

Mar. 26, 1996 (JP) .................................. 8-070339

(51) Int. Cl.[7] .................................. C23C 16/00
(52) U.S. Cl. .................. 118/500; 118/728; 156/345; 204/298.15; 361/234; 279/128
(58) Field of Search .................. 156/345; 118/728, 118/500; 204/298.15; 361/234; 279/128

(56) References Cited

U.S. PATENT DOCUMENTS

| | | | |
|---|---|---|---|
| 4,522,674 | * 6/1985 | Ninomiya et al. | 156/345 |
| 5,378,311 | * 1/1995 | Nagayama et al. | 156/643 |
| 5,557,215 | * 9/1996 | Saeki et al. | 324/765 |
| 5,583,737 | * 12/1996 | Collins et al. | 361/234 |
| 5,677,824 | * 10/1997 | Harashima et al. | 361/234 |
| 5,681,424 | * 10/1997 | Saito et al. | 156/643.1 |
| 5,793,192 | * 8/1998 | Kubly et al. | 323/312 |
| 5,815,366 | * 9/1998 | Morita et al. | 361/234 |
| 5,946,184 | * 8/1999 | Kanno et al. | 361/234 |

FOREIGN PATENT DOCUMENTS

| | | |
|---|---|---|
| 2-159744 | 6/1990 | (JP) . |
| 3-236255 | 10/1991 | (JP) . |
| 3-243188 | 10/1991 | (JP) . |
| 4-271286 | 9/1992 | (JP) . |
| 5-291194 | 11/1993 | (JP) . |

OTHER PUBLICATIONS

McGraw–Hill Encyclopedia of Science & Technology, 8th Edition, Jun. 1996.*
Robert M. Besancon, The Encyclopedia of Physics, Third Edition, pp. 946–949, Oct. 1991.*

* cited by examiner

Primary Examiner—Jeffrie R. Lund
(74) Attorney, Agent, or Firm—Foley & Lardner (57) ABSTRACT

Before a wafer 2 that is electrostatically held on a wafer platform 1 located in a vacuum vessel 8 is stripped with a half-lifting lift pin 4, inert gas is fed in the vacuum vessel 8 and ionized through an ultraviolet ray applying unit 6 to neutralize the charges distributed on the rear surface of the wafer 2 and the top surface of the wafer platform 1 to reduce the residual absorption and to make easy the step of stripping of the wafer 2 off the wafer platform 1.

8 Claims, 7 Drawing Sheets

SEMICONDUCTOR WAFER CHUCKING DEVICE AND METHOD FOR STRIPPING SEMICONDUCTOR WAFER

BACKGROUND OF THE INVENTION

The present invention relates to a device for chucking a semiconductor wafer and a method for stripping a semiconductor wafer, which are both arranged to electrostatically absorb the semiconductor wafer and strip it.

With the recent advance of a drying process in a process for manufacturing a semiconductor and larger diameter of the wafer, more uniform working has been required. For this purpose, it is necessary to positively fix and install the wafer on a wafer platform.

For example, in a reactive ion etching (as referred to as RIE, hereinafter) apparatus for dry-etching a wafer placed on an electrode where a high frequency is applied, the wafer is easily heated by plasma, so that a rise in a wafer temperature may thermally impair a photoresist for an etching mask or worsen the etched shape. To avoid these disadvantages, it is necessary to cool down the wafer being etched to a necessary temperature. For this purpose, the wafer is required to be hermetically held on the high frequency applied electrode controlled at a given temperature.

As such means for holding the wafer, in addition to a mechanical type or a vacuum type apparatus, an electrostatic chuck has been used wherein a dc electrode is buried in the lower portion of a wafer platform with a dielectric material therebetween so that the wafer makes a close contact with the placing surface of the high frequency applied electrode by virtue of electrostatic force. It has been well known that the electrostatic chuck is advantageous in making the wafer more tabular, usability in a vacuum chamber, and processability of an overall plane of the wafer surface. However, though the wafer can be efficiently cooled down by strong absorption, when stripping the wafer off the placing surface after etching the wafer, the charges left in a dielectric film cause residual absorption which prevents easy stripping of the wafer. For overcoming this shortcoming in stripping, various kinds of methods have been put into practise (for example, JP-A-159744/1990, JP-A-271286/1992 and JP-A-291194/1993).

Figure 5:
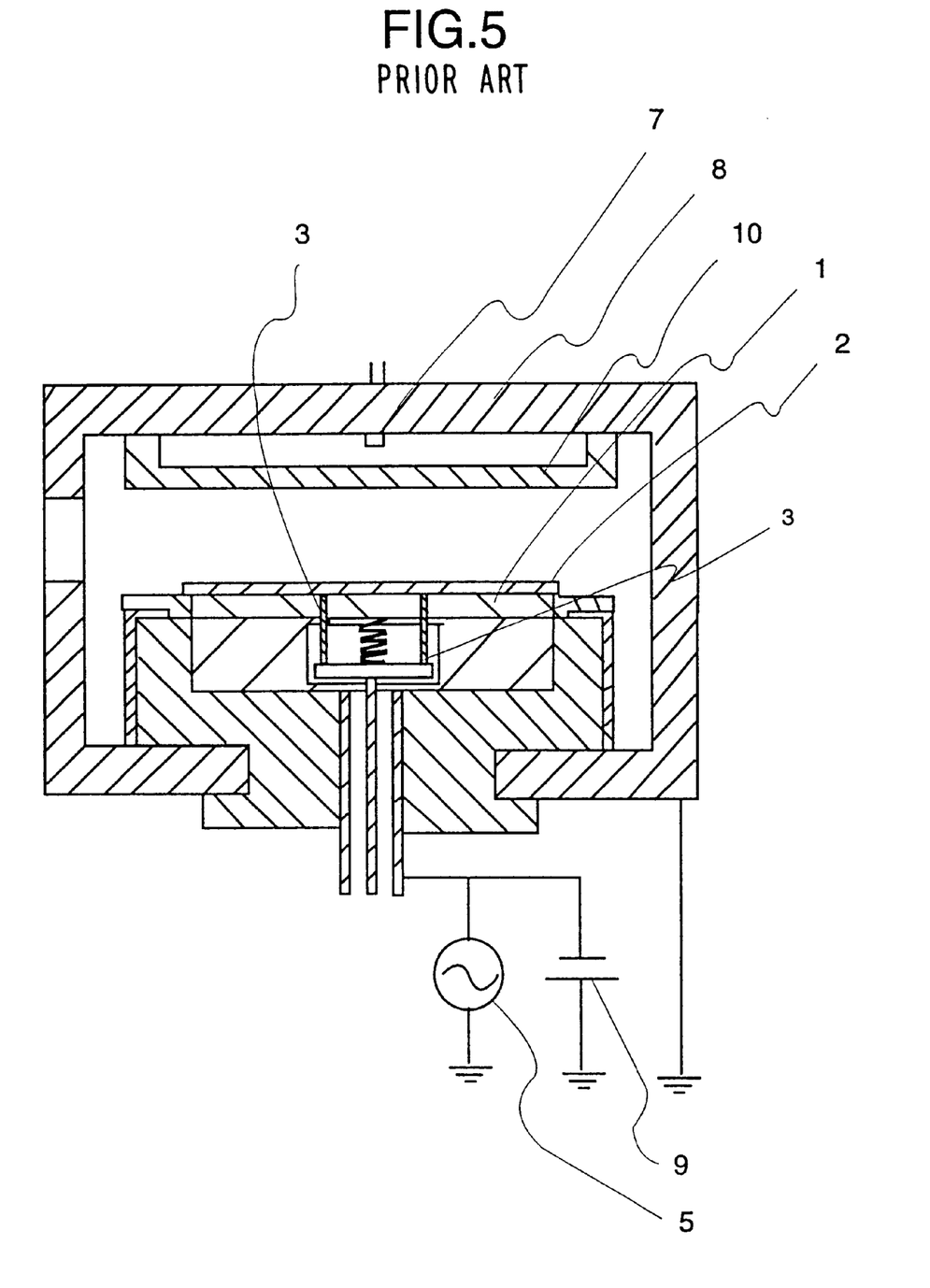
FIG. 5 is a sectional view showing a conventional RIE apparatus.

Next, the prior art will be concretely described below. FIG. 5 is a sectional view showing a treatment chamber provided in the conventional leaf treating type parallel plate RIE apparatus. The apparatus shown in FIG. 5 includes a grounded vacuum vessel 8, a gas inlet 7 for feeding given amounts of reactive gas and inert gas into the vacuum vessel 8, a wafer platform 1 having a wafer placed thereon where a high frequency power is applied, a grounded opposed electrode 10 having pores from which reactive and inert gases are blown, a high frequency power source 5 for generating plasma between the wafer platform 1 and the opposed electrode 10, a grounded wafer lift pin 3 for lifting up the wafer 2 to a position where the wafer 2 is stripped off the wafer platform 1 and carried out of the vacuum vessel 8, and an ESC power source 9 for applying a given ac voltage overlapped with the high frequency onto the wafer platform 1 for fixing the wafer 2 on the wafer platform 1 by electrostatic absorption.

Figure 6:
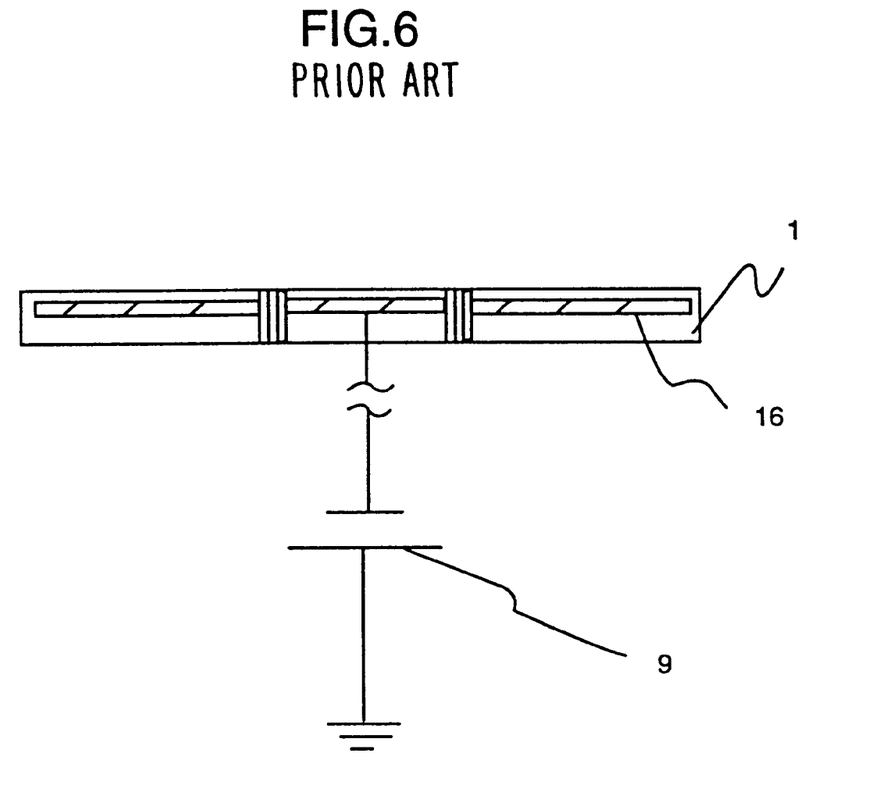
FIG. 6 is a sectional view showing a conventional wafer platform.

The wafer platform 1, as shown in FIG. 6, contains the ESC electrode 16 buried therein so that the dc voltage may be applied from the ESC power source 9 to the ESC electrode 16.

Next, the operation will be described. When the wafer lift pin 3 is located at a top dead center, the wafer 2 is carried out of the vacuum vessel 8 by a vacuum carrying robot 2 or the like to a given position on the wafer lift pin 3. Then, the wafer lift pin 3 is descended to a bottom dead center, where the wafer is placed on the center of the water placing surface of the wafer platform 1 controlled at a given temperature.

In this state, as keeping the inside of the vacuum vessel 8 at a given pressure, the reactive gas is fed from the gas inlet 7 at a given flow rate and the ESC power source 9 and the high frequency power source 5 are both operated, when the plasma is generated between the wafer platform 1 and the opposed electrode 10. By keeping this state for a certain time, the predetermined RIE treatment is completed. On completion of the RIE treatment, the ESC power source 9 is stopped and the reactive gas atmosphere inside the vacuum vessel 8 is replaced with inert gas for reducing or removing the residual absorption caused between the wafer 2 and the wafer platform 1. The wafer lift pushes the wafer 2 from the wafer placing surface of the wafer platform 1 to the carrying position, and then the wafer 2 is carried out of the vacuum vessel 8 by the vacuum carrying robot or the like. This is a completion of the series of operations.

Figure 7:
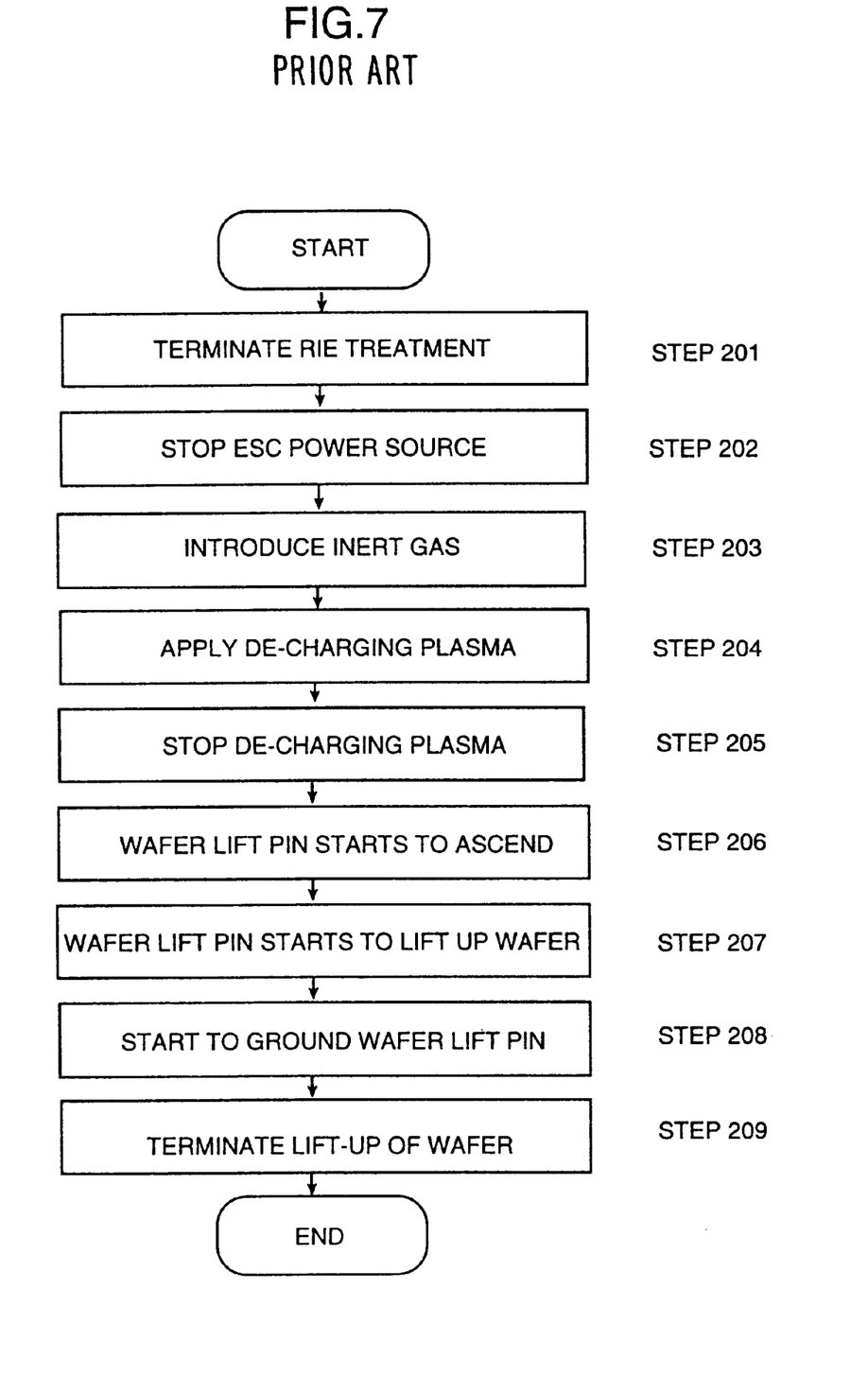
FIG. 7 is a flowchart showing an operation of stripping a wafer implemented in a conventional reactive ion etching device.

In turn, the description will be oriented to means for stripping the wafer 2 absorbed on the wafer placing surface of the wafer platform 1 off the wafer placing surface after the completion of the required RIE treatment with reference to FIG. 7. FIG. 7 is a flowchart showing an operation executed in stripping the wafer.

On the completion of the RIE treatment (step 201), the ESC power source 9 is stopped (step 202). Then, the gas being fed to the vacuum vessel 8 is switched from the reactive gas to the inert gas (step 203). The supply power from the high frequency power source 5 is lowered to the allowable minimum power for generating the plasma (as referred to as de-charging plasma, hereinafter) (step 204). Next, the high frequency power source 5 is stopped (step 205). These series of operations result in lowering a negative self-biased voltage occurring on the wafer 2, thereby suppressing extra etching to a minimum and reducing the residual electrostatic absorption.

Then, after the wafer lift pin 3 is moved up to the top dead point (steps 206 and 207), the wafer 2 is naturally stripped off the wafer placing surface and then is moved up to the carrying position (step 209). Further, by grounding the wafer lift pin 3 only in the operation of the apparatus (step 208), without losing the high frequency power applied in the RIE treatment, the residual charges between the rear side of the wafer 2 and the wafer platform 1 are discharged to the grounding side for further reducing the residual absorption. These series of operations results in implementing the highly reliable stripping of the wafer 2.

However, in the conventional wafer stripping system disclosed in JP-A-159744/1990, JP-A-27128619/1992 and JP-A-291194/1993, in stripping the wafer, the wafer 3 located on the wafer lift pin 2 is inclined or is bounced from the wafer lift pin 2. This action may move the wafer 3 out of a given place of the wafer lift pin 3, which leads to breakage of the wafer.

The grounds of the above phenomenon will be described along the prior arts. In the wafer stripping system described in JP-A-158744/1990, the wafer 2 held on the wafer platform 1 is forcibly stripped off the wafer platform by a wafer lift pin located on the center of the wafer platform 1 and a swing cam for lifting up the wafer 2 from the outer peripheral portion of the wafer platform 2 in concert with the pushup action of the wafer lift pin 3 located on the peripheral portion of the wafer platform 1. In the wafer stripping system described in JP-A-271286/1992, the wafer lift pin 3 or a pressurized gas injecting port is located on the outer peripheral portion of the wafer platform 1 so that the wafer 2 may be stripped off the wafer platform 1 by virtue of small force. In either system, the wafer 2 is forcibly stripped off the wafer platform 1 without reducing the residual absorption caused between the wafer 2 and the wafer platform 1. Hence, if the large residual charges are left if an oxide film is laid on the rear surface of the wafer, part of the wafer 2 is kept held on the wafer platform 1 in stripping. Hence, when the wafer 2 on the wafer lift pin 3 is inclined or part of the wafer 2 held on the wafer platform 1 overcomes the residual charges, the wafer 2 may be stripped off the wafer platform 1, when the repulsion may take place so that the repulsion may make the wafer 2 bounce.

In the wafer stripping system described in JP-A-291194/1993, after completion of the required etching, only the ESC power source 9 is stopped as keeping the high frequency power source 5 in operation. The residual charges corresponding to the supply voltage of the ESC power source 9 is lowered to the residual charges corresponding to the self-biasing voltage obtained by the de-charging plasma caused by the supply of the high frequency power, thereby reducing the residual absorption. This reduction makes it possible for the wafer 2 to be easily stripped off the wafer platform 1. However, when the higher frequency power is applied for the required etching treatment, the self-biasing voltage becomes greater than or the same as the the ESC power voltage 9, which eliminates the effect of reducing the residual absorption.

Further, in the wafer stripping system described in JP-A-291194/1993 and the foregoing prior, in the process of lifting up the wafer 2 from the wafer platform 1 by the wafer lift pin 3, since the wafer 2 is grounded through the wafer lift pin 3 while the wafer lift pin 3 is in contact with the wafer 2, the charges left between the wafer 2 and the wafer platform 1 are discharged to the grounding side through the wafer lift pin 3, thereby further reducing the residual absorption and improving the stripping characteristic. The creation of the insulating material generated in the RIE treatment adheres to the portion of the wafer lift pin 3 contacting with the wafer 2 with time. The deposition of the reactive creation serves to insulate the wafer 2 from the wafer lift pin 3, that is, keep the wafer 2 out of the grounding contact with the wafer lift pin 3. As a result, the charges left between the wafer 2 and the wafer platform 1 are disallowed to be discharged, thereby disabling to reduce the residual absorption.

In the wafer stripping system described in the foregoing prior arts and JP-A-291194/1993, the in-plane uniformity of the etching portion is made worse. This is because any of the foregoing prior arts is arranged to stop only the ESC power source 9 and generate the de-charging plasma from the high frequency power while the high frequency power source is in operation after the completion of the given etching treatment, for proceeding the overflown etching whose wafer in-plane uniformity is worse by the de-charging plasma.

SUMMARY OF THE INVENTION

It is an object of the present invention to solve the foregoing problems.

It is another object of the present invention to provide a method for stripping a semiconductor wafer and a semiconductor wafer chucking device which are arranged to eliminate the positional shift and the bounce of the wafer for preventing the impairment of the wafer when the wafer electrostatically held on the wafer platform located in the vacuum vessel is stripped off the wafer platform and prevent the lowering of the throughput and the wafer in-plane uniformity in the etching treatment by means provided in stripping the wafer.

In carrying out the object, the semiconductor wafer chucking device according to the present invention comprises a wafer platform, means for feeding inert gas, means for generating ionized gas, and a half-lifting lift pin, wherein the wafer platform is installed in a vacuum vessel and serves to electrostatically held the semiconductor wafer, the inert gas feeding means feeds the inert gas to the vacuum vessel, the ionized gas generating means excites the inert gas in the vacuum vessel and generates the ionized gas for neutralizing the charges charged with the semiconductor wafer and the wafer platform, and the half-lifting lift pin serves to strip part of the semiconductor wafer electrostatically absorbed on the wafer platform off the wafer platform and keep the inert gas ionized by the ionized gas generating means in contact with the rear surface of the semiconductor wafer and the top surface of the wafer platform. The method for stripping the semiconductor wafer according to the present invention arranged to de-charge the semiconductor wafer electrostatically held on the wafer platform and then stripping the wafer off the wafer platform, comprises the steps of: exciting the inert gas led in the vacuum vessel in which the wafer platform is installed and generating the ionized gas for neutralizing the charges charged on the semiconductor wafer and the wafer platform; and stripping part of the semiconductor wafer off the wafer platform in the atmosphere of the ionized gas and keeping the ionized gas in contact with the rear surface of the semiconductor wafer and the top surface of the wafer platform through the gap between the part of the semiconductor wafer and the wafer platform being stripped from each other, for neutralizing the charges charged on the semiconductor wafer and the wafer platform and de-charging the electrostatic force between the wafer platform and the semiconductor wafer. In the present invention constructed as described above, when stripping the wafer off the wafer platform, the inert gas is fed in the vacuum vessel. The ionized gas generating means keeps the vacuum vessel in the atmosphere of the ionized inert gas. The half-lifting lift pin is served to lift up the rear surface of the wafer earlier than the wafer lift pin so that only the part of the outer peripheral portion of the wafer is stripped off the wafer platform 1. In the stripping state, the gap between the rear surface of the wafer and the wafer platform is exposed to the atmosphere of the ionized inert gas, for neutralizing and coupling the residual charges and thereby reducing the residual absorption.

Hence, the wafer can be easily stripped off the wafer platform only by the operation of the wafer lift pin for lifting up the rear surface of the wafer.

BRIEF DESCRIPTION OF THE DRAWINGS

This and other objects, features and advantages of the present invention will become more apparent upon a reading of the following detailed description and drawings, in which.

DESCRIPTION OF THE PREFERRED EMBODIMENTS

In turn, the present invention will be described in detail with reference to the drawings.

At first, the first embodiment will be described below.

Figure 1:
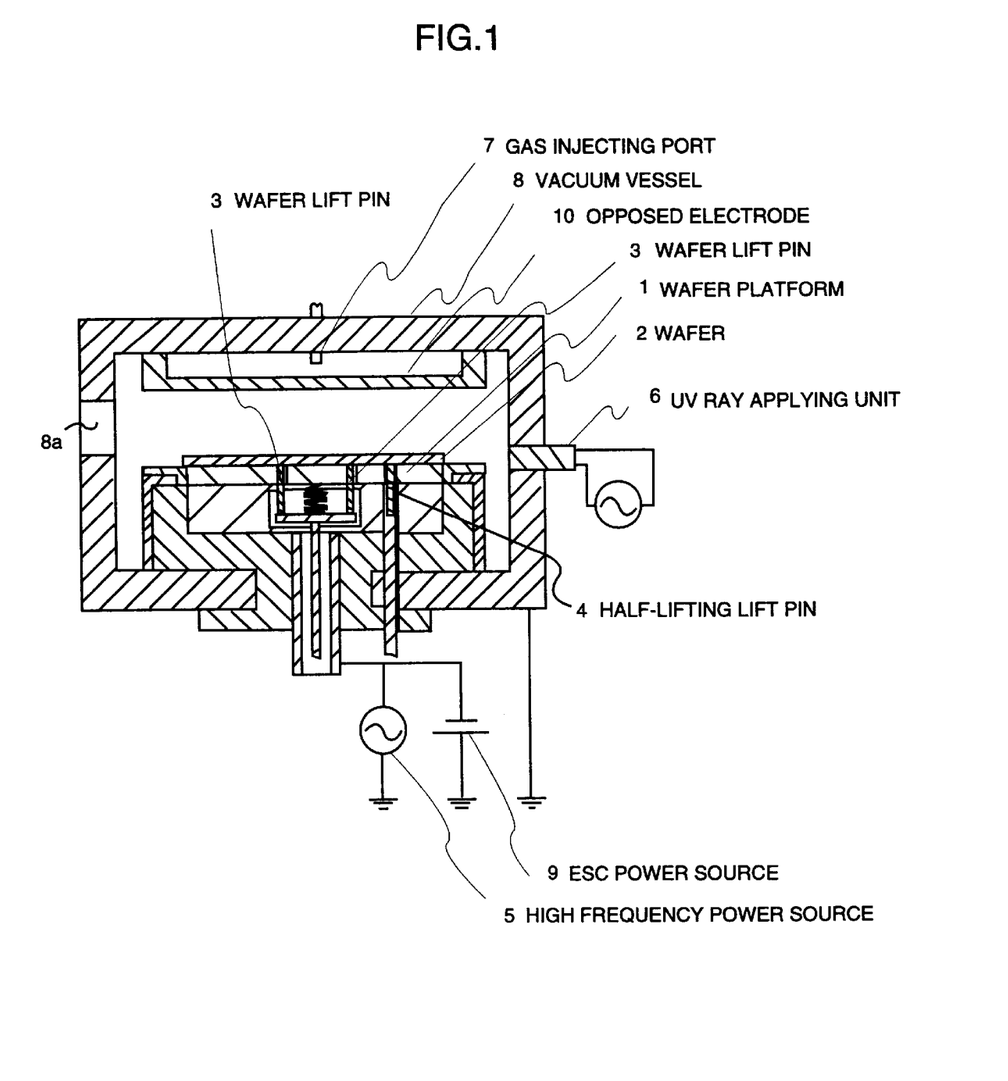
FIG. 1 is a sectional view showing a RIE apparatus provided with a semiconductor wafer chucking device according to an embodiment 1 of the present invention.

FIG. 1 shows the RIE apparatus provided with the semiconductor wafer chucking device according to the embodiment 1 of the present invention.

The RIE apparatus shown in FIG. 1 is constructed so that a wafer platform 1 is opposed to an opposed electrode 10 in a vacuum vessel 8, the vacuum vessel 8 and the opposed electrode 10 are grounded, and the high frequency power is fed from a high frequency power source 5 to the wafer platform 1. The opposed electrode 10 contains pores into which the inert gas from a gas inlet 7 is fed, so that the plasma is generated in the vacuum vessel 8. This is the essential part of the RIE apparatus.

The semiconductor wafer chucking device according to the present invention includes the wafer platform 1 on which the wafer 2 is placed in the grounded vacuum vessel 8, an ESC power source 9 for applying a dc voltage onto the wafer platform 1 for fixing the wafer 2 on the wafer platform 1 by virtue of electrostatic absorption, a wafer lift pin 3 for lifting the wafer 2 up to the carrying position (which is the same level as a wafer inlet 8a of the vacuum vessel 8), a half-lifting lift pin 4 for stripping part of an outer peripheral portion of the wafer 2 off the wafer platform 1 when stripping the wafer, an UV ray applying unit (ionized gas generating means) 6 for applying an UV (Ultraviolet) ray to nearby the rear surface of the half-lifted wafer 2, and a gas injecting port 7 for injecting the inert gas in place of the reactive gas in the vacuum vessel 8.

Figure 2:
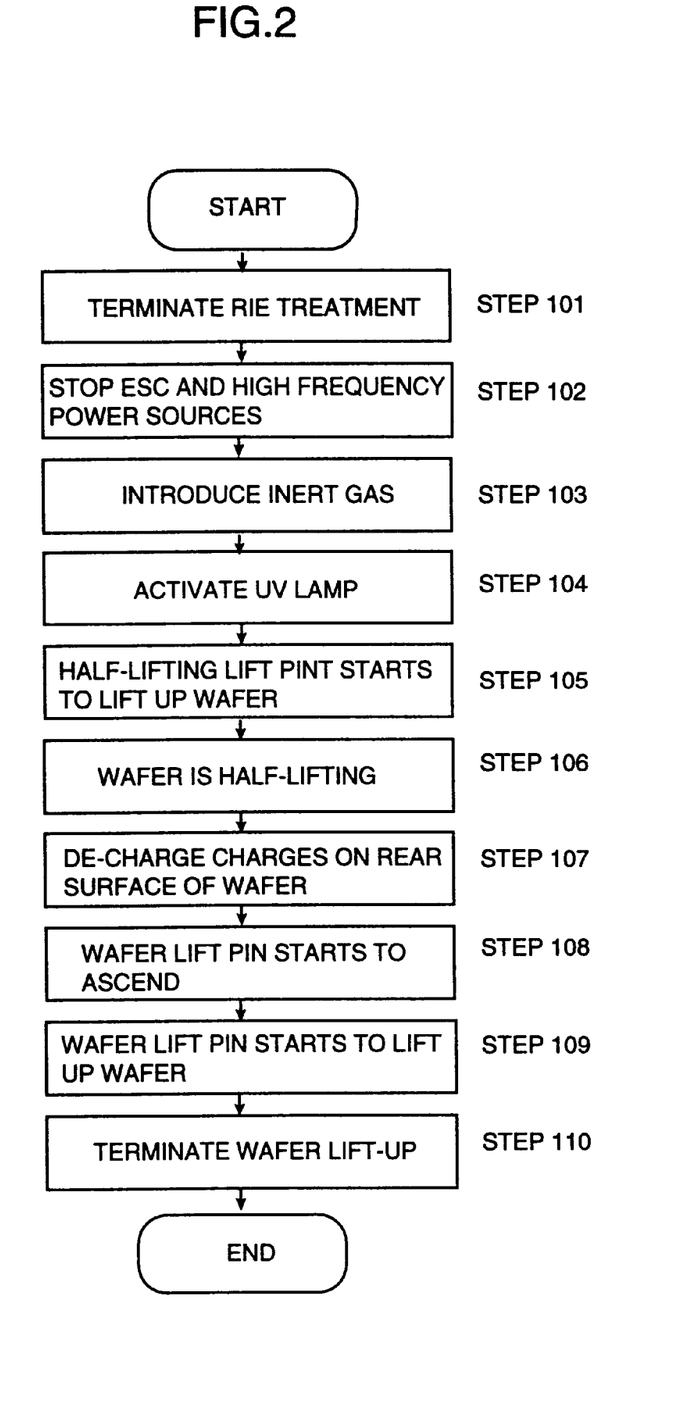
FIG. 2 is a flowchart showing an operation of stripping a wafer in the embodiment 1 of the present invention.

Upon termination of the RIE treatment (step 101), the ESC and high frequency power sources are stopped (step 102). In this state, the inert gas is led in the vacuum vessel 8 through the gas injecting port 7 (step 103), so that the atmosphere of the inert gas is kept in the vacuum vessel 8. In this state, the UV ray applying unit 6 applies the UV ray to the inside of the vacuum vessel 8 (step 104). The inert gas absorbs the energy of the UV ray so that the inert gas is excited and ionized.

Next, the half-lifting lift pin is served to lift up the wafer 2 from the rear surface of the wafer 2 (step 105). The part of the wafer 2 lifted by the half-lifting lift pin 4 is stripped off the wafer platform 1, while the opposite part of the wafer 2 is held on the wafer platform 1 by virtue of the residual absorption left on the outer peripheral portion of the wafer platform 1 (step 106). The inert gas ionized by the UV ray has a neutralizing effect on the charges existing on the rear surface of the wafer 2 and the top surface of the wafer platform 1, thereby quickly reducing the residual absorption left on the rear surface of the wafer 2 and the top surface of the wafer platform 1 (step 107). Herein, the de-charging mechanism through the effect of the ionized gas will be supplemented with reference to FIG. 3.

Figure 3:
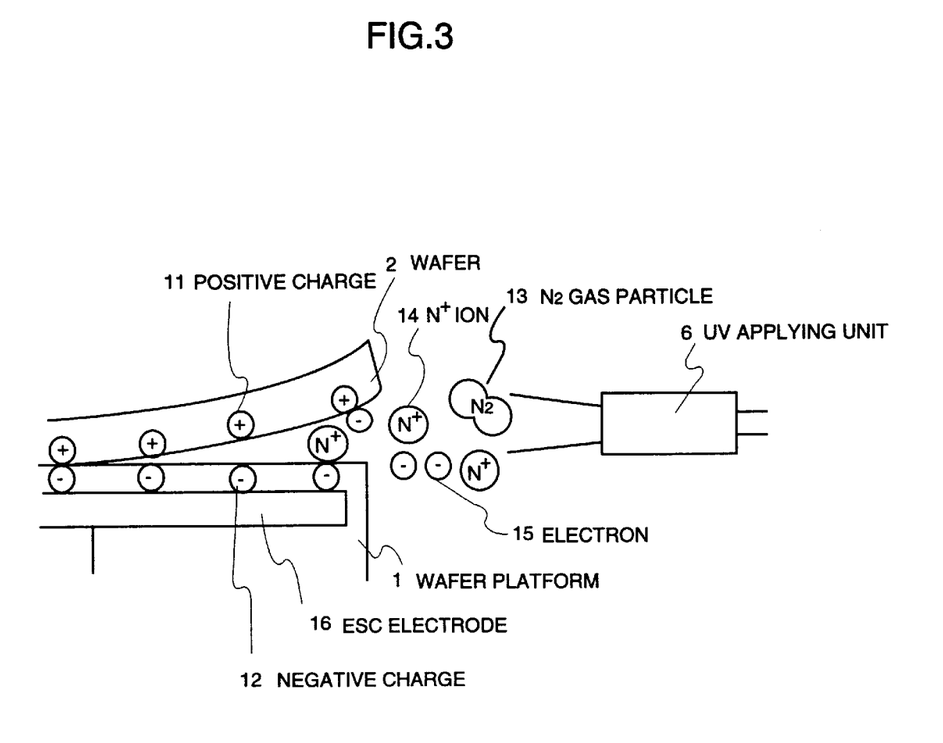
FIG. 3 is a view showing a principle of de-charging through ionized gas.

Positive charges 11 exist on the rear surface of the half-lifted part of the wafer 2, while negative charges 12 caused by a negative voltage applied by the ESC electrode 15 exist on the top surface of the wafer platform 1. Those charges are the cause of the residual absorption that is a bottleneck in stripping the wafter.

The inert gas particles 13 such as $N_2$ gas are filled in advance between the wafer 2 and the wafer platform 1. Then, the UV ray applying unit 6 operates to apply the UV ray to the inert gas particles 13 so that the energy-absorbed $N_2$ gas particles are excited and thereby separated into $N^+$ ions 14 and electrons 15. These $N^+$ ions 14 are attracted to the negative charges 12 existing on the wafer platform 1 having the opposite polarity and are electrically coupled therewith. The electrons 15 are coupled with the positive charges 11, so that both of the electrons 15 and the positive charges 11 are neutralized, which results in removing the residual charges.

The foregoing process makes it possible to sufficiently reduce the residual absorption between the wafer 2 and the wafer platform 1. Hence, the wafer lift pin 3 is raised (steps 108 and 109), so that the wafer 2 may be easily stripped off the water platform 1 without positional shift or bouncing (step 110). Further, the time taken in reducing the residual absorption is as short as one second, which is far shorter than the time taken in activating the de-charging plasma (about five to ten seconds). Hence, the rate-determining stage of the wafer stripping process never lowers the throughput. Further, after completion of the required etching treatment, the wafer may be stripped without the etching process, so the wafer in-plane uniformity in the etching treatment is not made worse.

Figure 4:
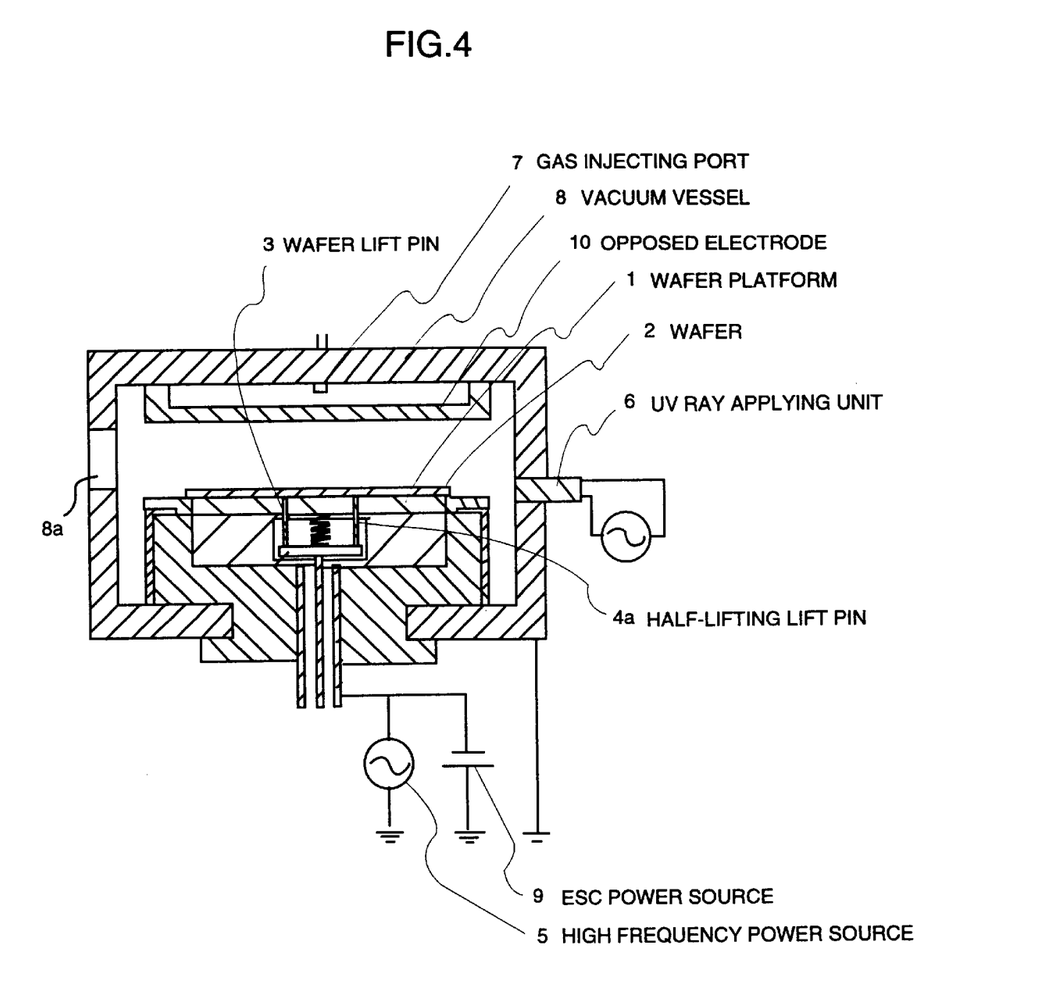
FIG. 4 is a sectional view showing a RIE apparatus provided with a semiconductor wafer chucking device according to an embodiment 2 of the present invention.

Next, the embodiment 2 of the present invention will be described with reference to FIG. 4. FIG. 4 is a sectional view showing the RIE apparatus provided with the semiconductor wafer chucking device according to the embodiment 2 of the present invention.

The embodiment 2 of the present invention is different from the embodiment 1 in that the half-lifting lift pin 4a uses one of the wafer lift pins 3. The half-lifting lift pin 4a whose pin tip is higher than the tip of the wafer lift pin 3 is kept in the waiting state under the wafer 2 so that the lift pin 4a is positioned to be faced with the UV ray applying unit 6. When stripping the wafer 2 off the wafer platform 1, the half-lifting lift pin 4a is lifted up in advance of the remaining wafer lift pins 3 so that the part of the wafer 2 is stripped. The embodiment 2 has the same principle on which the residual absorption between the wafer 2 and the wafer platform 1 as the embodiment 1.

The operation of the embodiment 2 is basically the same as that of the embodiment 1. In the embodiment 2, the wafter lift pins 3 are moved in synchronous to the half-lifting lift pin 4a. However, the height relation between the half-lifting lift pin 4a and the lift pins 3 from the start to the end of the wafer stripping is made constant so that the wafer 2 is inclined after stripping the wafer 2. In actual, however, the height of the half-lifting lift pin 4a is higher by about 1 mm than the height of the lift pins 3, so the inclination of the wafer 2 after stripping the wafer 2 is negligible. This embodiment 2 is therefore advantageous in that it provides the same performance and the simplified structure.

As described above, according to the present invention, the absorption caused by the electrostatics left between the wafer and the wafer platform is removed before stripping the wafer off the wafer platform. These operations make it possible to eliminate the horizontal positional shift and the bouncing of the wafer, thereby preventing the damage of the wafer. Further, the removal of the horizontal positional shift of the wafer allows the positive carrying of the wafer in and out of the wafer platform.

Further, the present invention does not need a special action for eliminating the wafer, which makes contribution to reducing the time taken in stripping the wafer.

The entire disclosure of Japanese Patent Application No. 8-070339 filed on Mar. 26, 1996 including specification, claims, drawing and summary are incorporated herein by reference in its entirety.

What is claimed is:

1. A semiconductor wafer chucking device comprising:
   a vacuum vessel;
   a wafer platform located inside said vacuum vessel and for holding said semiconductor wafer by electrostatic force;
   means for feeding inert gas in said vacuum vessel;
   means for exciting and ionizing said inert gas in said vacuum vessel to neutralize charges on said semiconductor wafer and said wafer platform;
   a half-lifting lift pin for stripping part of said semiconductor wafer electrostatically held on said wafer platform off said wafer platform; and
   a wafer lift pin including said half-lifting lift pin, wherein said wafer lift pin lifts said semiconductor wafer to an inclined position to a height where said semiconductor wafer is carried in or out of said vacuum vessel.

2. The semiconductor wafer chucking device as claimed in claim 1, wherein said half-lifting pin allows said excited and ionized inert gas to come into contact with a rear surface of said semiconductor wafer and a surface of said wafer platform off which the rear surface of said semiconductor wafer was stripped.

3. The semiconductor wafer chucking device as claimed in claim 1, further comprising a wafer lift pin provided independently of said half-lifting pin for lifting said semiconductor wafer off said wafer platform to a height where said semiconductor wafer is carried in or out of said vacuum vessel.

4. A semiconductor wafer chucking device comprising:
   a vacuum vessel;
   a wafer platform located inside said vacuum vessel and for holding said semiconductor wafer by electrostatic force;
   means for feeding inert gas in said vacuum vessel;
   means for exciting and ionizing said inert gas in said vacuum vessel to neutralize charges on said semiconductor wafer and said wafer platform;
   a half-lifting lift pin for stripping part of said semiconductor wafer electrostatically held on said wafer platform off said wafer platform;
   wherein said means for exciting and ionizing applies an ultraviolet ray to said inert gas to ionize said inert gas; and
   wherein said means for exciting and ionizing applies said ultraviolet ray to a rear surface of said semiconductor wafer and a top surface of said wafer platform.

5. A semiconductor wafer chucking device comprising:
   a vacuum vessel;
   a wafer platform located inside said vacuum vessel and for holding said semiconductor wafer by electrostatic force;
   means for feeding inert gas in said vacuum vessel;
   means for exciting and ionizing said inert gas in said vacuum vessel to neutralize charges on said semiconductor wafer and said wafer platform;
   a half-lifting lift pin for stripping part of said semiconductor wafer electrostatically held on said wafer platform off said wafer platform;
   a wafer lift pin for lifting said semiconductor wafer off said wafer platform to a height where said wafer is carried in or out of said vacuum vessel;
   wherein said means for exciting and ionizing applies an ultraviolet ray to said inert gas to ionize said inert gas; and
   wherein said means for exciting and ionizing applies said ultraviolet ray to a rear surface of said semiconductor wafer and a top surface of said wafer platform.

6. A semiconductor wafer chucking device comprising:
   a vacuum vessel;
   a wafer platform located inside said vacuum vessel and for holding said semiconductor wafer by electrostatic force;
   means for feeding inert gas in said vacuum vessel;
   means for exciting and ionizing said inert gas in said vacuum vessel to neutralize charges on said semiconductor wafer and said wafer platform;
   a wafer lift pin for stripping part of said semiconductor wafer electrostatically held on said wafer platform off said wafer platform to allow said inert gas ionized by said means for exciting and ionizing to come into contact with a rear surface of said semiconductor wafer and a surface of said wafer platform, and moving said semiconductor wafer to a height where said wafer is carried in or out of said vacuum vessel;
   wherein said means for exciting and ionizing applies an ultraviolet ray to said inert gas to ionize said inert gas; and
   wherein said means for exciting and ionizing applies said ultraviolet ray to a rear surface of said semiconductor wafer and a top surface of said wafer platform.

7. A semiconductor wafer chucking device comprising:
   a vacuum vessel;
   a wafer platform located inside the vacuum vessel;
   a semiconductor wafer held on the wafer platform by electrostatic force;
   ionized inert gas in the vacuum vessel;
   a lift pin for stripping the semiconductor wafer off the wafer platform;
   wherein the lift pin includes a half-lifting pin for stripping a part of the semiconductor wafer off the wafer platform; and
   wherein the lift pin comprises the half-lifting pin, wherein the lift pin lifts the semiconductor wafer in an inclined position to a height where the semiconductor wafer is carried in or out of the vacuum vessel.

8. A semiconductor wafer chucking device as claimed in claim 7, further comprising an ultraviolet ray applying unit for applying ultraviolet ray to produce the ionized inert gas in the vacuum vessel.

* * * * *